United States Patent [19]

Waller

[11] Patent Number: 4,975,884

[45] Date of Patent: Dec. 4, 1990

[54] PRESETTABLE SYNCHRONOUS PREDECODED COUNTER

[75] Inventor: William K. Waller, Boise, Id.

[73] Assignee: Micron Technology, Inc., Boise, Id.

[21] Appl. No.: 361,652

[22] Filed: Jun. 5, 1989

[51] Int. Cl.⁵ .............................................. G11C 8/04
[52] U.S. Cl. ............................. 365/230.06; 365/236; 365/233; 377/116
[58] Field of Search .................. 365/230.06, 233, 236, 365/239, 78; 307/272.2; 377/115, 116

[56] References Cited

U.S. PATENT DOCUMENTS 4,623,986 11/1986 Chauvel ........................ 365/236 X Primary Examiner—Joseph A. Popek
Attorney, Agent, or Firm—Stanley N. Protigal; Angus C. Fox, III

[57] ABSTRACT

An inventive presettable synchronous predecoded counter which provides predecoding and counting in a single circuit, with an inventive dual-input flip-flop included in the design. This predecoded counter is used advantageously to sequentially access elements in a semiconductor memory array. This invention offers small size and simple design.

19 Claims, 7 Drawing Sheets

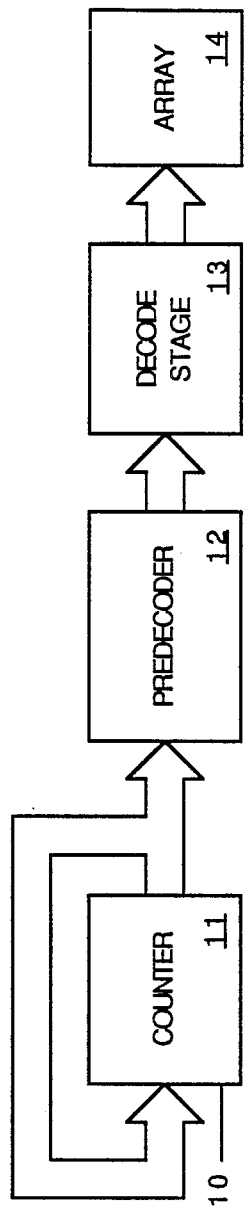
FIG. 1 -- PRIOR ART
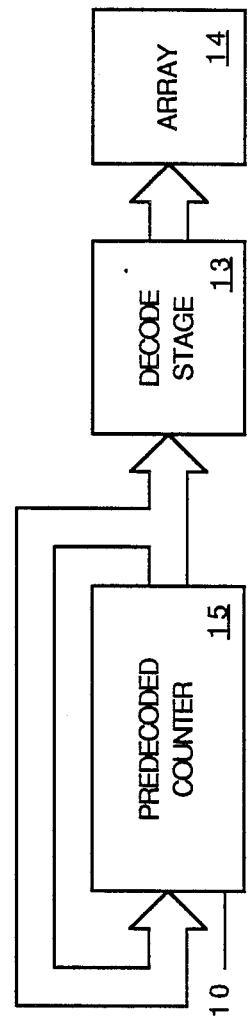
FIG. 2

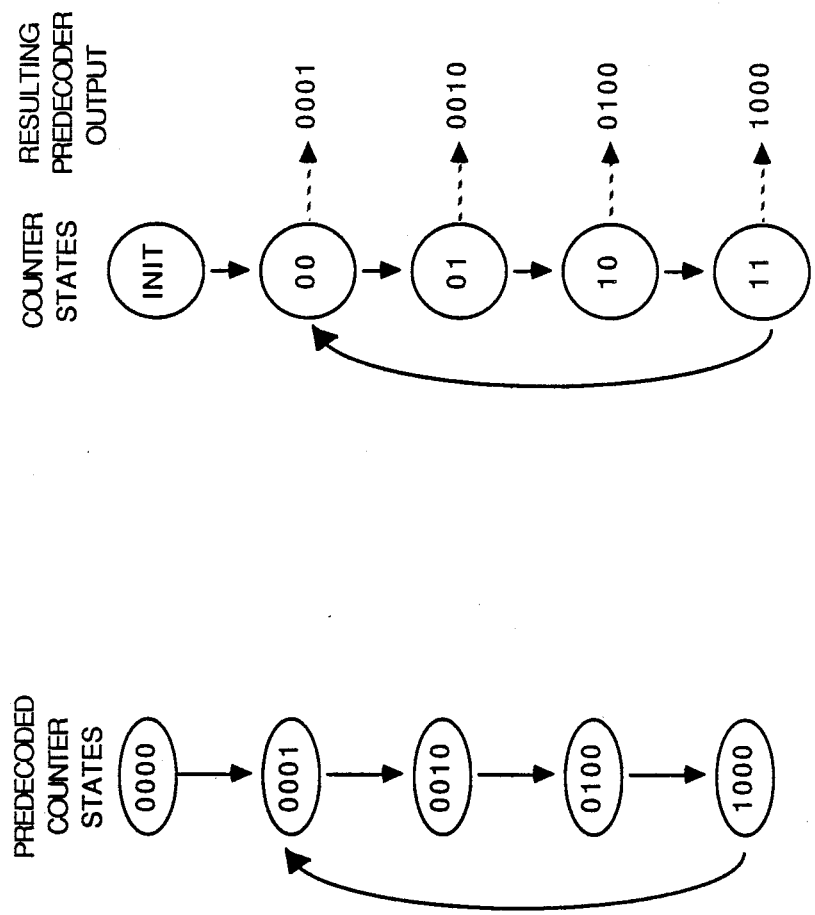

| | D0 | D1 | CLKM | CLKS* | S* | R* | Q | Q* |
|---|---|---|---|---|---|---|---|---|
| 1: | 0 | 0 | ⊓ | ⊓ | 1 | 1 | 0 | 1 |
| 2: | 0 | 1 | ⊓ | ⊓ | 1 | 1 | 1 | 0 |
| 3: | 1 | 0 | ⊓ | ⊓ | 1 | 1 | 1 | 0 |
| 4: | X | X | X | 0 | 1 | 0 | 0 | 1 |
| 5: | X | X | X | 0 | 0 | 1 | 1 | 0 |

FIG. 6

PRESETTABLE SYNCHRONOUS PREDECODED COUNTER

FIELD OF THE INVENTION

This invention generally relates to counting and decoding circuitry used in a semiconductor memory chip, and more particularly relates to a predecoded counter combination, such as might be used in a sequential access memory (SAM).

BACKGROUND OF THE INVENTION

Semiconductor memories are commonly randomly accessible. This means that a user must provide an address for each element accessed in a memory array. Some memories, such as SAMs, are sequentially accessed. This means that a clock pulse is provided to the SAM, and elements within a predetermined block within the array are sequentially accessed, one element per pulse. This is used with advantage in devices such as dual-port and triple-port RAMs (random access memories), which have both sequential and random access ports.

A well known way to accomplish sequential access is illustrated in FIG. 1. Clock 10 pulses counter 11, which increments by calculating its next output by using feedback from its present output. Counter 11 outputs an address to predecoder 12, which outputs the address predecoded to decode stage 13, which then presents the address fully decoded to array 14. Predecoder 12 and decode stage 13 work together to efficiently access an element in array 14 which corresponds to the address output of counter 10. As clock 10 pulses, counter 11 counts, and elements in array 14 are sequentially accessed. Often counter 11 is presettable, allowing the sequential access to begin at a predetermined element within array 14.

It would be advantageous to combine a counter and a predecoder into a single stage, thus reducing design complexity and size.

It would also be advantageous if the predecoded counter was presettable, allowing sequential access to begin at any predetermined element within a memory array.

It would further be advantageous if the predecoded counter were synchronous. The outputs of the predecoded counter would then change simultaneously, thus avoiding spurious activation of one or more outputs.

SUMMARY OF THE INVENTION

An inventive predecoded counter provides a counter and predecoder in one circuit. Included in this device is an inventive dual-input flip-flop. This combination offers the advantages of simpler design, fewer circuit elements, and smaller circuit size.

The inventive predecoded counter also is synchronous, having no ripple on its outputs, eliminating a logic level within an attached decode stage.

BRIEF DESCRIPTION OF THE DRAWINGS

FIG. 1 is a block diagram showing prior art counter in use.

FIG. 2 is a block diagram showing the inventive predecoded counter in use.

FIG. 3 is a state diagram of the inventive predecoded counter.

FIG. 4 is a state diagram of a prior art counter and predecoder.

FIG. 6 is a chart illustrating the operation of a dual-input flip-flop used in the predecoded counter.

DETAILED DESCRIPTION OF THE PREFERRED EMBODIMENT

A predecoded counter is provided according to the invention. FIG. 3 shows sequential states of a preferred predecoded counter. Predecode and count are performed simultaneously. For comparison, FIG. 4 shows sequential states of an ordinary shave-and-a-haircut (two bit) counter. The states are outputted to a predecoder, whose outputs are also shown.

Figure 5:
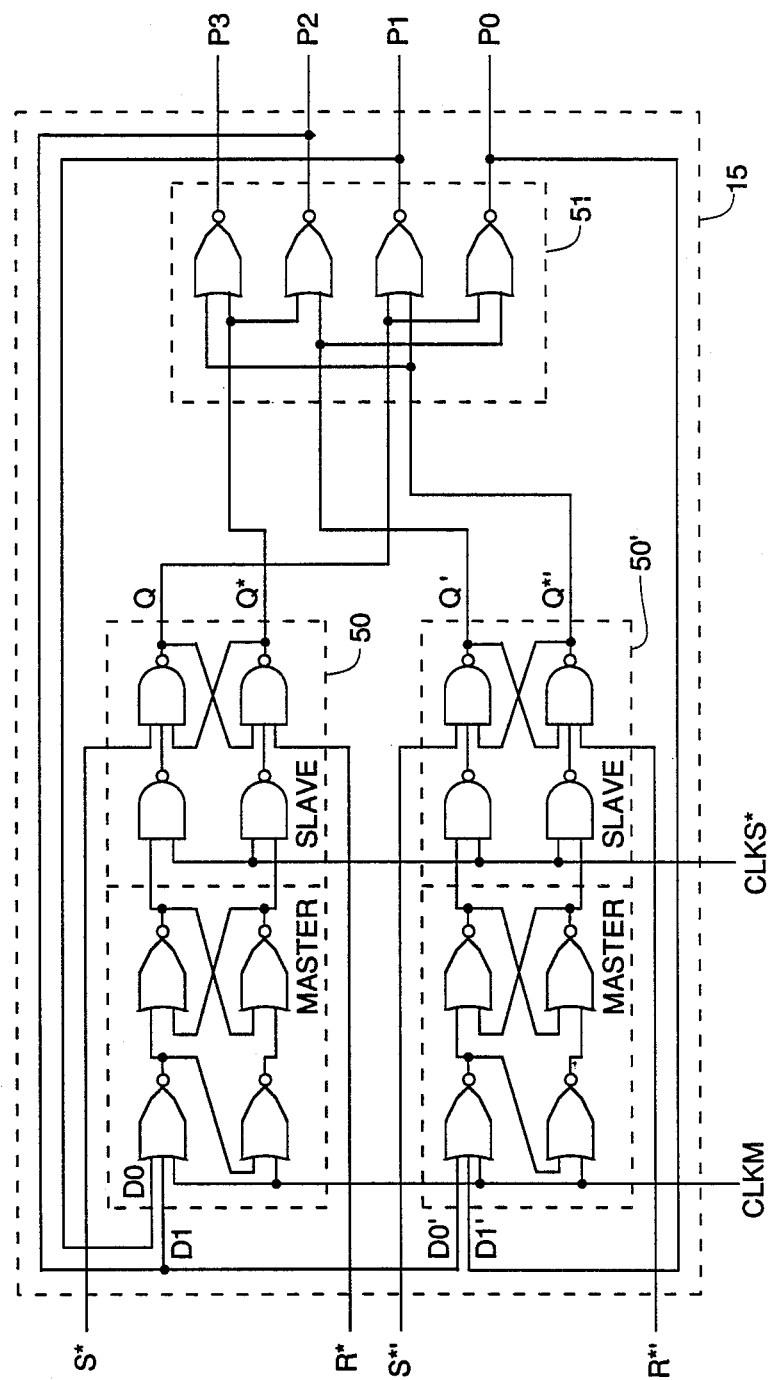
FIG. 5 details an inventive one-of-four predecoded counter.

The preferred embodiment of a one-of-four predecoded counter 15 is detailed in FIG. 5. It includes: two dual-input master-slave D-type flip-flops 50 and 50' with data inputs D0, D1, D0', and D1', presetting inputs S*, R*, S*', and R*', separate clock inputs CLKM and CLKS*, and flip-flop outputs Q, Q*, Q', and Q*'; and predecoder 51 with predecoded outputs P0 (least significant), P1, P2, and P3 (most significant). All of these elements are connected as shown in FIG. 5, so that the flip-flops 50 and 50' synchronously output directly to predecoder 51, and feedback is taken from predecoded outputs P0, P1, P2, and P3 in order to generate a next state. These elements preferably share a common semiconductor substrate.

The operation of flip-flop 50 within a predecoded counter such as 15 is now summarized. The master stage is transparent when input CLKM is low, and latches on CLKM rising edge. The slave stage is transparent when CLKS* is high, and latches on CLKS* falling edge. Because of the predecoded counter 15 feedback from outputs P0–P2 to inputs D0, D1, D0', D1', flip-flops 50 and 50' are not allowed to have both the master stage and the slave stage transparent at one time. To latch a new value into flip-flop 50, CLKM and CLKS* are simultaneously (or almost simultaneously) brought low and then high (see FIG. 6, lines 1–3). When at least one of D0 and D1 are high (lines 2 and 3), a high output is latchable at Q. When both D0 and D1 are low (line 1), a low output is latchable at Q. When flip-flop 50 is used in the preferred embodiment, D0 and D1 are never high at the same time because only one output of predecoder 51 is high at one time. To preset flip-flop 50, one of S* and R* is brought low while CLKS* is low (lines 4 and 5). R* and S* are both high for normal operation (lines 1–3), but when S* goes low (line 5) Q asynchronously goes high, and when R* goes low (line 4) Q asynchronously goes low (R* and S* low at the same time is a disallowed state). Q* is always the inverse of Q.

Figure 7:
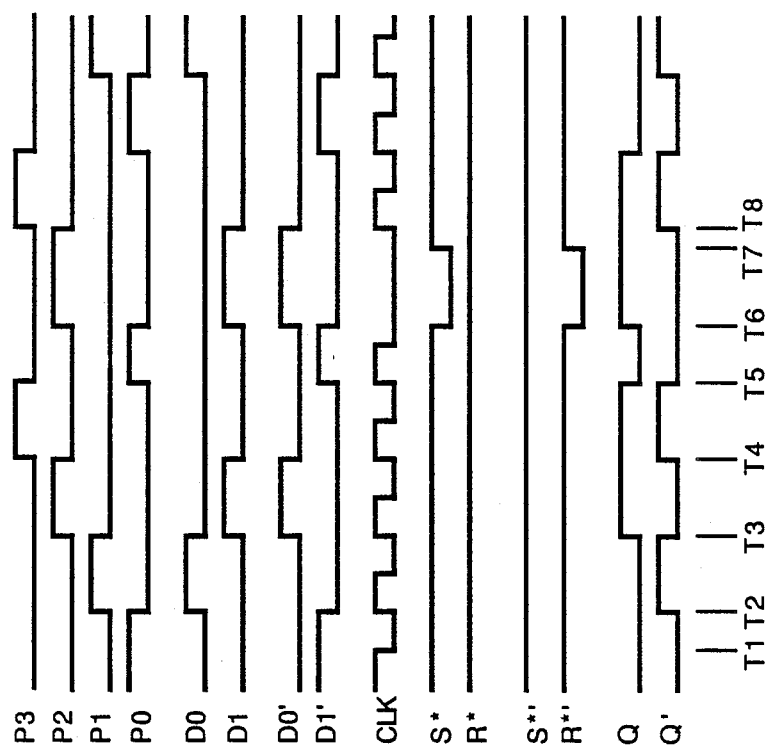
FIG. 7 is a timing diagram illustrating operation of the predecoded counter.

Sequential states of the preferred embodiment are shown in FIG. 7. At time T1 in this figure, the embodiment is initialized to select P0. CLK is a signal placed on CLKM and CLKS* simultaneously, for purposes of illustration. At each positive CLK edge through times T2–T5 the embodiment is shown predecodably counting through P1, P2, P3, and P0, respectively.

At time T6, the embodiment is preset to select P2 by bringing S* and R*' low. S* and R'* return high at time T7 but outputs P0-P3 remain latched. At time T8, predecoded counting resumes, beginning at selected state P2.

Figure 8:
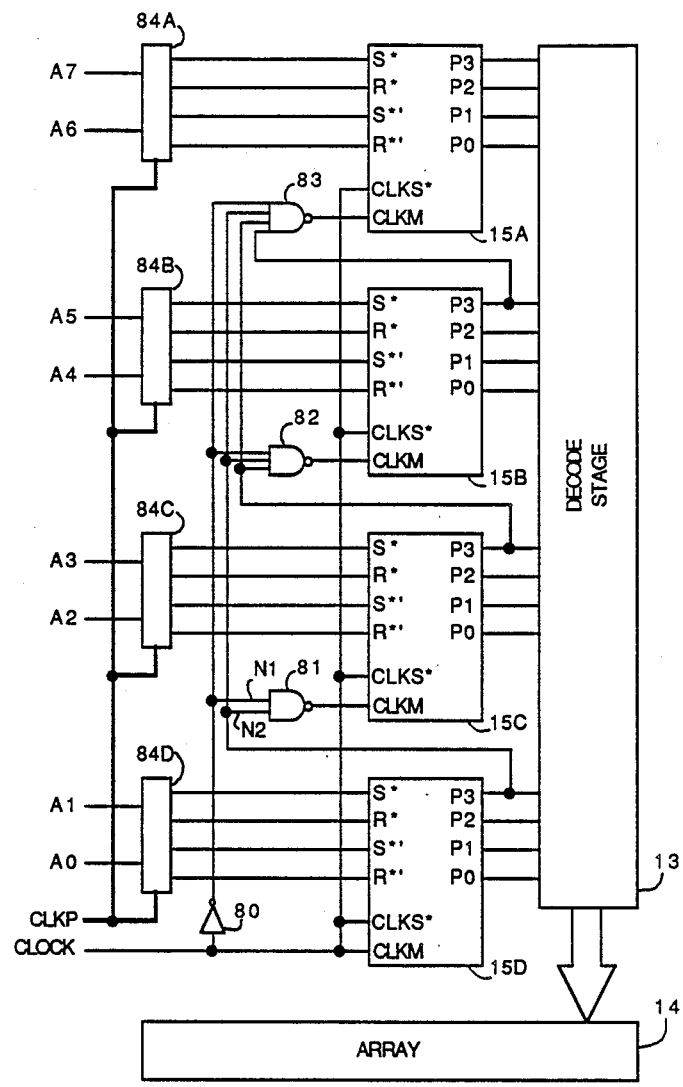
FIG. 8 shows cascaded predecoded counters accessing a memory array having 256 elements.

FIG. 8 details the preferred embodiment used in a memory system. One-of-four predecoded counters 15A-15D are synchronously cascaded, each predecoded counter 15 outputting to different levels in decode stage 13, which selects one of 256 elements in array 14, as shown. Decode stage 13 is a tree decoder having four branching levels. CLOCK clocks the master stage of predecoded counter 15D and slave stages of predecoded counters 15A-15D. Counters 15A-15D are cascaded using logic devices 80-83 connected as shown so that a given predecoded counter (for example, 15A) will not increment until the most significant (P3) outputs of all of the lesser significant predecoded counters (for example, 15B-15D) are high and CLOCK undergoes a positive transition.

Figure 9:
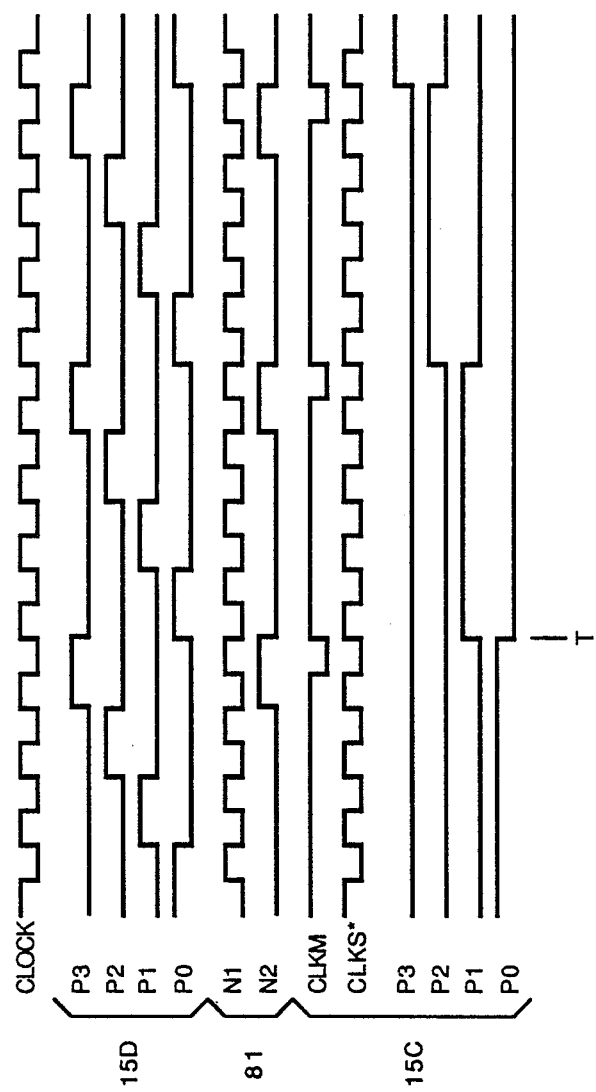
FIG. 9 is a chart illustrating operation of cascaded predecoded counters 15C and 15D, shown in FIG. 8.

For clarity, in FIG. 9, pertinent signals of cascaded predecoded counters 15D and 15C and NAND gate 81 are shown in action. Predecoded counter 15D is shown incrementing normally (as was seen in FIG. 7). Inputting P3 of predecoded counter 15D and inverted CLOCK to the NAND gate 81, which clocks CLKM of predecoded counter 15C, causes 15C to increment only when P3 of predecoded counter 15D is high and CLOCK undergoes a positive transition (shown at time T of FIG. 9).

Clearly, although not shown in FIG. 9, predecoded counter 15B will not increment unless P3 of both 15C and 15D are high and CLOCK undergoes a positive transition, as evidenced by the three-input gate 82. Similarly, predecoded counter 15A will not increment unless P3 of all three of 15B, 15C, and 15D are high and CLOCK undergoes a positive transition, as evidenced by the four-input gate 83.

Predecoded counters 15A-15D in this configuration can increment only on a rising edge of CLOCK. If all of predecoded counters 15A-15D are ready to increment at the same time, they all will increment on the same rising edge of CLOCK. This means that, although predecoded counters 15A-15D are cascaded, there is no ripple effect on their outputs. This is a necessity: rippling inputs to decode stage 13 can be quite a problem, as multiple decoder branches (not shown) may be activated during the ripple. Further, a rippling counter is actually slower.

Predecoded counter 15A is preset by using one or more signals in CLKP to cause circuit 84A to latch A6 and A7, passing A7 to S*, A7* to R*, A6 to S*', and A6* to R*'. When predecoded counter 15A is not being preset, circuit 84A inputs high levels to S*, R*, S*', and R*'. Predecoded counters 15B, 15C, and 15D are similarly preset by circuits 84B, 84C, and 84D, respectively.

Referring again to FIG. 5, the choice of NOR gates in predecoder 51 and master stages of flip-flops 50 and 50', and NAND gates in slave stages of flip-flops 50 and 50' is deliberate. Decode stage 13, for which this embodiment was designed, happens to require active-high selection signals from predecoder 51. Using NORs in predecoder 51 connected as shown in FIG. 5 provides only one of P0-P3 high (active) at one time. Flip-flop 50 and 50' slave stages drive predecoder 51 and have NANDs as output devices to avoid momentary false selections among P0-P3.

Latches like the slave stages within flip-flops 50 and 50' have outputs that do not toggle instantaneously: one output will change before the other. The outputs of a NAND latch (such as the slave stage in flip-flop 50, for example) will both momentarily be high during a toggle. Similarly, the outputs of a NOR latch will both momentarily be low during a toggle. NOR predecoder 51 is immune to the momentary simultaneous lows of NAND slave stages of flip-flops 50 and 50', and thus avoids false selection among outputs P0-P3. Similarly, had decode stage 13 required active-low selection signals, predecoder 51 would have comprised NAND gates and the slave stages of flip-flops 50 and 50' would have comprised NOR gates to avoid false selection among outputs P0-P3.

In flip-flops 50 and 50' the master stages comprise NOR gates and the slave stages comprise NAND gates simply to make CLKM and CLKS* have opposing active states. This means CLKM and CLKS* can be clocked in parallel and flip-flop 50 always has a latched stage. Having at least one stage latched at any one time gives flip-flop 50 stability: if both the master stage and the slave stage is transparent at one time, an infinite loop would result as feedback from outputs P0-P2 drive inputs D0, D1, D0', and D1', thus changing outputs P0-P2.

Although individual circuit elements are described above, the invention is preferably embodied in an integrated semiconductor circuit. The claims should be interpreted accordingly.

I claim:
1. An electronic device, comprising:
   (a) a counter, said counter comprising first and second flip-flops, each having multiple data inputs;
   (b) a predecoder; and
   (c) said predecoder having inputs responsive to outputs of said flip-flops, and said counter having inputs responsive to outputs of said predecoder, so that as said counter is clocked, predecoder outputs are singly and sequentially activated, wherein
   a first of said data inputs of said first flip-flop is responsive to a first of said predecoder outputs, a second of said data inputs of said first flip-flop is responsive to a second of said predecoder outputs, said first data input of said second flip-flop is responsive to said second predecoder output, and said second data input of said second flip-flop is responsive to a third of said predecoder outputs, so that as said flip-flops are clocked, predecoder outputs are singly and sequentially activated.

2. The device of claim 1, wherein said counter is presettable.

3. The device of claim 1, wherein each of said flip-flops can be set or cleared, thereby rendering the device presettable.

4. The device of claim 1, wherein said flip-flops are clocked simultaneously.

5. The device of claim 1, wherein each of said flip-flops comprises:
   (a) a master stage, comprising first, second, third, and fourth logic gates of a first kind, a first input of said second gate responsive to an output of said first gate, a first input of said third gate responsive to said output of said first gate, a first input of said fourth gate responsive to an output of said second gate, a second input of said third gate responsive to an output of said fourth gate, a second input of said fourth gate responsive to an output of said third gate, at least second and third inputs of said first gate being said multiple data inputs to said flip-flop, a first input of said first gate and a second input of said second gate together being a master clock input, said outputs of said third and fourth gates being first and second outputs of said master stage;

(b) a slave stage, comprising first, second, third, and fourth logic gates of a second kind, first inputs of said first and second gates being first and second inputs to said slave stage, second inputs together of said first and second gates being a slave clock input, a first input of said third gate responsive to an output of said first gate, a first input of said fourth gate responsive to an output of said second gate, a second input of said third gate responsive to an output of said fourth gate, a second input of said fourth gate responsive to an output of said third gate, said outputs of said third and fourth gates being outputs of said flip-flop; and (c) said first slave stage input responsive to said first master stage output, and said second slave stage input responsive to said second master stage output.

6. The device of claim 5, wherein said predecoder comprises:

(a) first, second, third, and fourth logic gates of said first kind, each having an output and first and second inputs; and (b) said first input of said first gate and said second input of said third gate responsive in parallel to a first of said counter outputs, said second input of said first gate and said first input of said second gate responsive in parallel to a second of said counter outputs, said second input of said second gate and said second input of said fourth gate responsive in parallel to a third of said counter outputs, and said first input of said third gate and said first input of said fourth gate responsive in parallel to a fourth of said counter outputs, said gate outputs being said predecoder outputs.

7. The device of claim 6, wherein said first kind of logic gate is NOR, and said second kind of logic gate is NAND.

8. The device of claim 6, wherein said first kind of logic gate is NAND, and said second kind of logic gate is NOR.

9. The device of claim 5, further comprising:

(a) a third input of said third logic gate of said second kind being a first presetting input, a third input of said fourth logic gate of said second kind being a second presetting input.

10. The device of claim 5, wherein said first kind of logic gate is NOR, and said second kind of logic gate is NAND.

11. The device of claim 5, wherein said first kind of logic gate is NAND, and said second kind of logic gate is NOR.

12. A flip-flop having multiple data inputs, comprising:

(a) a master stage, comprising first, second, third, and fourth logic gates of a first kind, a first input of said second gate responsive to an output of said first gate, a first input of said third gate responsive to said output of said first gate, a first input of said fourth gate responsive to an output of said second gate, a second input of said third gate responsive to an output of said fourth gate, a second input of said fourth gate responsive to an output of said third gate, a first input of said first gate and a second input of said second gate together being a master clock input, at least second and third inputs of said first gate being multiple data inputs to said flip-flop, said outputs of said third and fourth gates being first and second outputs of said master stage;

(b) a slave stage, comprising first, second, third, and fourth logic gates of a second kind, first inputs of said first and second gates being first and second inputs to said slave stage, second inputs together of said first and second gates being a slave clock input, a first input of said third gate responsive to an output of said first gate, a first input of said fourth gate responsive to an output of said second gate, a second input of said third gate responsive to an output of said fourth gate, a second input of said fourth gate responsive to an output of said third gate, said outputs of said third and fourth gates being outputs of said flip-flop;

(c) said first slave stage input responsive to said first master stage output, and said second slave stage input responsive to said second master stage output; and (d) a third input of said third logic gate of said second kind being a first presetting input, a third input of said fourth logic gate of said second kind being a second presetting input.

13. The flip-flop of claim 12, wherein said first kind of logic gate is NOR, and said second kind of logic gate is NAND.

14. The flip-flop of claim 12, wherein said first kind of logic gate is NAND, and said second kind of logic gate is NOR.

15. A sequential access memory, comprising:

(a) a multiplicity of synchronous predecoded counter, comprising a counter and a predecoder, said predecoder having inputs responsive to outputs of said counter, and said counter having inputs responsive to outputs of said predecoder, so that as said counter is clocked, predecoder outputs are singly and sequentially activated, said multiplicity of said predecoded counters being synchronously cascaded;

(b) a decode stage, responsive to said predecoder outputs; and (c) an array of memory elements, responsive to said decode stage, so that as said predecoded counter increments, said memory elements are sequentially selected, wherein each of said counters comprise first and second clockable flip-flops, each having multiple data inputs, wherein each of said flip-flops can be set or cleared, thereby rendering said predecoded counter presettable, and wherein a first of said data inputs of said first flip-flop is responsive to a first of said predecoder outputs, a second of said data inputs of said first flip-flop is responsive to a second of said predecoder outputs, a first of said data inputs of said second flip-flop is responsive to said second predecoder output, and a second of said data inputs of said second flip-flop is responsive to a third of said predecoder outputs, so that as said flip-flops are clocked, predecoder outputs are singly and sequentially activated.

16. The memory of claim 15, wherein each of said flip-flops comprises:

(a) a master stage, comprising first, second, third, and fourth logic gates of a first kind, a first input of said second gate responsive to an output of said first gate, a first input of said third gate responsive to said output of said first gate, a first input of said fourth gate responsive to an output of said second gate, a second input of said third gate responsive to an output of said fourth gate, a second input of said fourth gate responsive to an output of said third gate, a first input of said first gate and a second input of said second gate together being a master clock input, at least second and third inputs of said first gate being said multiple data inputs to said flip-flop, said outputs of said third and fourth gates being first and second outputs of said master stage;

(b) a slave stage, comprising first, second, third, and fourth logic gates of a second kind, first inputs of said first and second gates being first and second inputs to said slave stage, second inputs together of said first and second gates being a slave clock input, a first input of said third gate responsive to an output of said first gate, a first input of said fourth gate responsive to an output of said second gate, a second input of said third gate responsive to an output of said fourth gate, a second input of said fourth gate responsive to an output of said third gate, said outputs of said third and fourth gates being outputs of said flip-flop;

(c) said first slave stage input responsive to said first master stage output, and said second slave stage input responsive to said second master stage output; and (d) a third input of said third logic gate of said second kind being a first presetting input, a third input of said fourth logic gate of said second kind being a second presetting input.

17. The memory of claim 16, wherein each of said predecoders comprise:

(a) first, second, third, and fourth logic gates of said first kind, each having an output and first and second inputs; and (b) said first input of said first gate and said second input of said third gate responsive in parallel to a first of said counter outputs, said second input of said first gate and said first input of said second gate responsive in parallel to a second of said counter outputs, said second input of said second gate and said second input of said fourth gate responsive in parallel to a third of said counter outputs, and said first input of said third gate and said first input of said fourth gate responsive in parallel to a fourth of said counter outputs, said gate outputs being said predecoder outputs.

18. The memory of claim 17, wherein said first kind of logic gate is NOR, and said second kind of logic gate is NAND.

19. The device of claim 17, wherein said first kind of logic gate is NAND, and said second kind of logic gate is NOR.

* * * * *